United States Patent
Bennington

(10) Patent No.: US 12,007,509 B2
(45) Date of Patent: Jun. 11, 2024

(54) SYSTEMS AND METHODS FOR PRE-BLINDING LIDAR DETECTORS

(71) Applicant: LG INNOTEK CO., LTD, Seoul (KR)

(72) Inventor: Dane P Bennington, Pittsburgh, PA (US)

(73) Assignee: LG INNOTEK CO., LTD., Seoul (KR)

( * ) Notice: Subject to any disclaimer, the term of this patent is extended or adjusted under 35 U.S.C. 154(b) by 884 days.

(21) Appl. No.: 17/031,633

(22) Filed: Sep. 24, 2020

(65) Prior Publication Data

US 2022/0091234 A1 Mar. 24, 2022

(51) Int. Cl.
| | |
|---|---|
| G01S 7/484 | (2006.01) |
| G01S 7/487 | (2006.01) |
| G01S 17/931 | (2020.01) |
| H01L 31/107 | (2006.01) |

(52) U.S. Cl.
CPC ............. *G01S 7/484* (2013.01); *G01S 7/487* (2013.01); *G01S 17/931* (2020.01); *H01L 31/107* (2013.01)

(58) Field of Classification Search
CPC ........ G01S 7/484; G01S 7/487; G01S 7/4868; G01S 7/495; G01S 7/4812; G01S 7/4865; G01S 7/497; G01S 7/483; G01S 7/4866; G01S 7/4861; G01S 17/931; G01S 17/10; G01J 2001/4466; H01L 31/107
See application file for complete search history.

(56) References Cited

U.S. PATENT DOCUMENTS

| | | | |
|---|---|---|---|
| 8,637,875 B2 | 1/2014 | Finkelstein et al. | |
| 8,908,157 B2 | 12/2014 | Eisele et al. | |
| 10,217,889 B2 | 2/2019 | Dhulla et al. | |
| 2006/0072100 A1* | 4/2006 | Yabe | G01S 17/10 356/5.01 |
| 2016/0327639 A1* | 11/2016 | Albert | G01S 17/10 |
| 2018/0284239 A1* | 10/2018 | LaChapelle | G01S 17/10 |
| 2019/0250256 A1 | 8/2019 | Gunnam et al. | |
| 2021/0041534 A1* | 2/2021 | Egawa | G01S 7/4815 |

OTHER PUBLICATIONS

Williams, George M. "Optimization of Eyesafe Avalanche Photodiode LiDar for Automobile Safety and Autonomous Navigation Systems", Optical Engineering, Mar. 28, 2017, pp. 1-9, vol. 56, issue 3, SPIE, United States.

* cited by examiner

*Primary Examiner* — Luke D Ratcliffe
(74) *Attorney, Agent, or Firm* — Birch, Stewart, Kolasch & Birch, LLP

(57) ABSTRACT

Systems, methods, and computer-readable media are disclosed for a systems and methods for pre-blinding light detectors. An example method may include sending, by a processor of a LIDAR system and at a first time, a signal to a light source of the LIDAR system, the signal causing the light source to provide a light input to a photodetector of the LIDAR system, wherein the light input to the photodetector causes the photodetector to initiate a recovery period. The example method may also include emitting, by a laser of the LIDAR system, a first light pulse into an environment at a second time. The example method may also include receiving, by the photodetector, return light associated with the first light pulse from an object in the environment, the return light reaching the photodetector at a third time, the third time being after the photodetector has ended the recovery period.

17 Claims, 3 Drawing Sheets

SYSTEMS AND METHODS FOR PRE-BLINDING LIDAR DETECTORS

BACKGROUND

In some LIDAR systems (for example, coaxial beam path LIDAR systems), the power transmitted from, and received back by, the LIDAR system may follow the same or largely the same optical path. In doing so, there may several points at which transmitted energy can find its way back to the receiver without having left the LIDAR system, or while within a range to which the LIDAR system may not be sensitive. This may be an issue with avalanche-photodetection-based systems (for example, systems that use Avalanche Photodiodes (APDs)), which produce a large signal upon the reception of a relatively small amount of photonic energy, but may also require a recovery period to elapse before the photodiode can respond to a subsequent incipient photonic return. That is, the photodetector may be momentarily 'blinded' when it receives a return light pulse, and may remain blinded for a period of time based on its recovery period, during which any incipient light energy may produce limited to no response in the photodetector. As there may inevitably be some light return in a coaxial beam path LIDAR system that is not of interest (e.g., internal reflections), there may be some period of time after the laser beam has left the range of uninteresting reflections where the LIDAR is undesirably blind.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Figure 1:
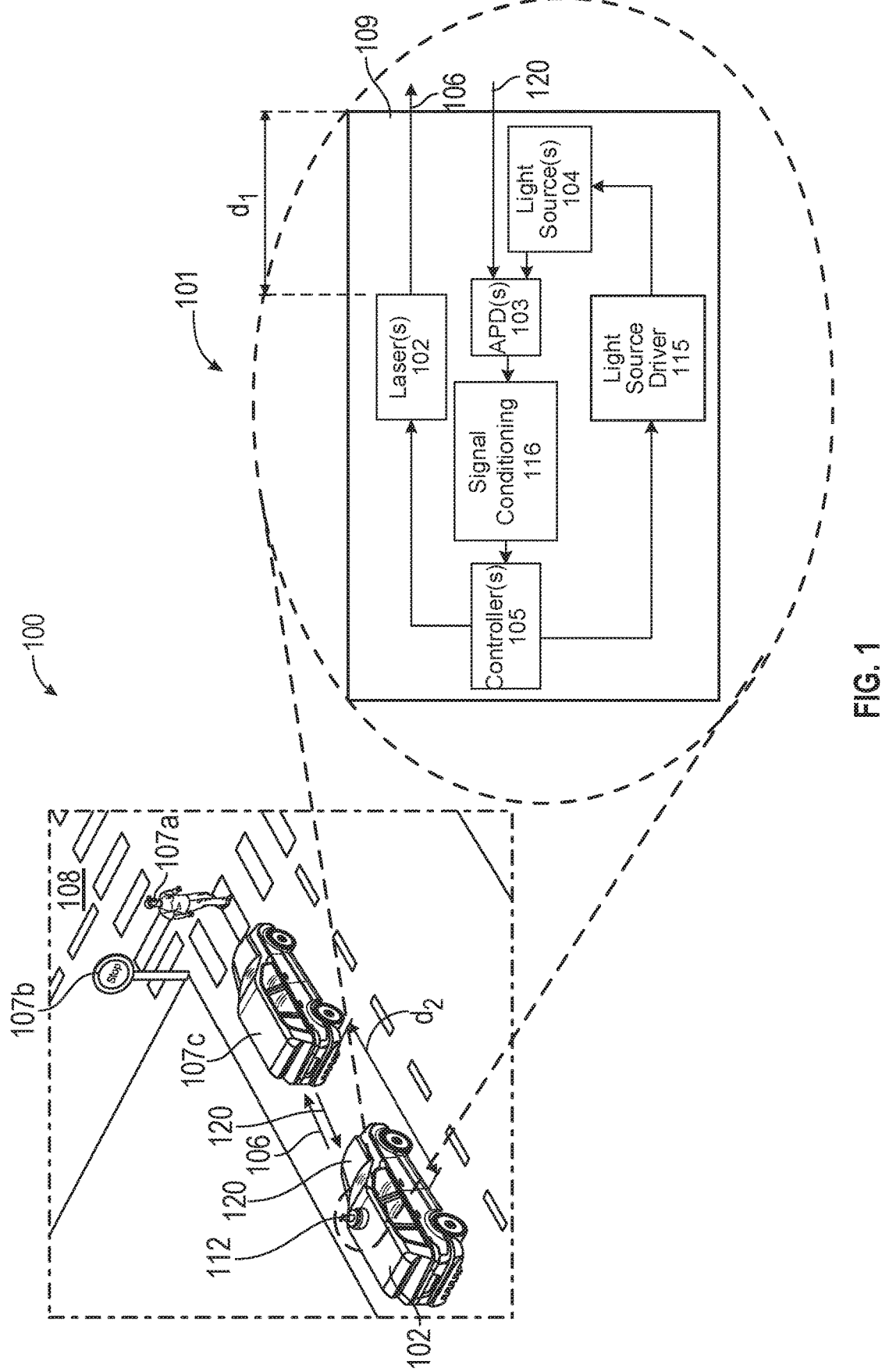
FIG. 1 depicts an example process, in accordance with one or more example embodiments of the disclosure.

This disclosure relates to, among other things, systems and methods for pre-blinding LIDAR detectors. In some cases, the LIDAR detectors may be referred to as "photodetectors," "photodiodes," or the like herein. Additionally, reference may be made herein to a single "photodetector" or "photodiode," but the LIDAR systems described herein may also similarly include any number of such detectors. In some instances, the detectors may be photodiodes, which may be diodes that are capable of converting incoming light photons into an electrical signal. The photodiodes may be implemented in a LIDAR system that may emit light into an environment and may subsequently detect any light returning to the LIDAR system (for example, through the emitted light reflecting from an object in the environment) using the photodetectors. As one example implementation, the LIDAR system may be implemented in a vehicle (for example, autonomous vehicle, semi-autonomous vehicle, or any other type of vehicle), however the LIDAR system may be implemented in other contexts as well. The photodetectors may also more specifically be Avalanche Photodiodes (APD), which may function in the same manner as a normal photodiode, but may operate with an internal gain as well. Consequentially, an APD that receives the same number of incoming photons as a normal photodiode may produce a much greater resulting electrical signal through an "avalanching" of electrons, which may allow the APD to be more sensitive to smaller numbers of incoming photons than a normal photodiode. An APD may also operate in Geiger Mode, which may significantly increase the internal gain of the APD. An APD may also need to undergo a recovery period following the avalanche in which the APD is quenched. Quenching the APD may refer to reducing the voltage of the APD below its breakdown voltage so that the APD may be able to detect subsequent photons. This recovery period may take tens of nanoseconds to complete, which may be problematic if light emitted from the LIDAR system reflects from components internal to the LIDAR system and is detected by the photodetector. Such internal reflections may cause the photodetector to prematurely avalanche and enter its recovery period at a time after the light is emitted by an emitter (for example, a laser diode) within the LIDAR system, but before the emitted light exits the LIDAR system and enters the environment. The environment, for example, may refer to a region of space proximate to the LIDAR system. For example, if the LIDAR system is located on a vehicle that is traversing an intersection, and is emitted light pulses, the environment may refer to the portion of the intersection at which the light pule are being emitted. However, this is merely an example, and the environment may similarly refer to any other physical space external to the LIDAR system. Continuing with the above explanation, a photodetector avalanching as a result of internal reflections may result in the photodetector being in its recovery period for a period of time after the emitted light has entered the environment since the recovery time of the photodetector may be greater than the time it takes the emitted light to exit the LIDAR system. Consequentially, the photodetector may effectively be "blind" (for example, unable to detect photons) to short range return light. That is, if there are any objects within a short range of the LIDAR system that reflect the emitted light back to the photodetector, and the photodetector is still in its recovery period, then the photodetector may be unable to determine that the object exists in front of the LIDAR system. This may be problematic because any system that relies on the information captured by the LIDAR system may be unable to accurately and consistently detect when objects are located within a short range of the LIDAR system. For example, an autonomous vehicle that relies on a LIDAR system to perform object detection may often need to be able to detect objects as close as 10 centimeters away from the vehicle. It may take light less than a nanosecond to reach this range, so if the detector's recovery period if greater than this, then objects at this range may remain undetected.

In some embodiments, to alleviate this effective photodetector "blindness" to short range objects that may occur when internal reflections take place within the LIDAR system, the photodetector may be "pre-blinded" in such a manner that the photodetector may be forced to enter its recovery period. For example, this pre-blinding may be effectuated while emitted light is traveling through the interior portion of the LIDAR system, but may also be effectuated at any other time as well. Pre-blinding the photodetector may involve forcing the photodetector to avalanche by causing light from an external source to be emitted towards the photodetector (for example, light that may not necessarily have been emitted by the emitter in the LIDAR system, but from some other external light source pointed in the direction of the photodetector). This light input may be used to force the photodetector to avalanche in a manner similar to which it may avalanche as the result of return light from the environment reaching the photodetector. The light input may be provided by any number of light sources, for example, a Light Emitting Diode (LED). Using a high-speed LED may be beneficial because it may not require the power of a laser, but may have rapid response time for a wavelength the photodetector is capable of detecting. The photodetector may be sensitive to a much wider range of wavelengths than the emitter of the LIDAR system (for example, emitting device 102) so an LED used for pre-blinding of the photodetector may not need to have the same wavelength as the emitter. This may allow for optical wavelength filtering to prevent the pre-blinding photons from the LED from bouncing around inside the LIDAR and tainting a received signal. The light source may also include any other type of photonic emitter (which may be controllable, for example) that may emit at least some energy on a wavelength that is detectable by the photodetector (to name a few additional examples, the light source may include an infrared (IR) LED), incandescent sources, halogen bulbs gas lasers, etc.).

In some embodiments, the light source may be electrically connected with a controller included within the LIDAR system (for example controller 105 described with reference to FIG. 1, computing portion 313 described with respect to FIG. 3, or any other controller described herein) that may be used to control the timing at which the light source is triggered to provide light to the photodetector to forcibly avalanche the photodetector. However, in some cases, the light source may also be connected to a circuit that may allow the light source to turn on at various intervals without the use of the controller. The light source may be positioned at any number of orientations or distances from the photodetector so long as the photodetector is capable of receiving light emitted by the light source. For example, the light source may be positioned in front of the photodetector. The light source may need to be positioned so as to not block any light being emitted by the emitter of the LIDAR system. Additionally, the distance at which the light source is positioned from the photodetector may alter the time at which the controller sends a signal for the light source to illuminate, as the any added distance between the light source and photodetector may add additional travel time for light from the light source to the photodetector, which may add an additional time delay. This may need to be accounted for to ensure that the light source is triggered at the appropriate time before light is emitted from the emitter of the LIDAR system to ensure the photodetector ends its recovery period when the emitted light exits the LIDAR system and enters the environment. The photodetector may not necessarily end its recovery period at the exact point in time when the emitted light exits the LIDAR system, but may similarly end its recovery period before or after this time as well.

In some embodiments, this pre-blinding may be performed even before light is emitted from the emitter of the LIDAR system, so that the photodetector may begin its recovery period before the light is emitted from the emitter. With the photodetector being within its recovery period while the emitted light is traversing the interior of the LIDAR system (and even before the light is emitted and enters the interior of the LIDAR system), the photodetector may be prevented from avalanching based on any light resulting from internal reflections within the LIDAR system. As a result, this may prevent the photodetector from beginning a recovery period while the emitted light is traversing the interior of the LIDAR system, which, as explained above, may be undesirable because the recovery period may then extend beyond the point at which the emitted light enters the environment given the amount of time it may take the photodetector to quench. The photodetector may be forced to avalanche and enter its recovery period prior to the light being emitted by the emitter because the recovery period of the photodetector may be longer than the time it takes the emitted light to traverse the interior of the LIDAR system. The exact time at which the photodetector may be forced to avalanche so that it ends its recovery period as the emitted light enters the environment may depend on a number of factors, such as the recovery time of the particular photodetector, the distance the emitted light needs to travel through the LIDAR system before it reaches the environment, the distance between the photodetector and a light source that forces the avalanching of the photodetector (as may be described below), as well as other factors, such as temperature and an applied bias voltage to the photodetector. Additionally, in some cases, the timing of the forced blinding of the photodetector may be such that the photodetector ends its recovery period after the emitted light exits the LIDAR system.

In some embodiments, the timing at which the photodetector may be forced to avalanche may also depend on data feedback. For example, data feedback received from the environment and/or components of the LIDAR system, such as a photodetector. As a first example, a first photodetector may be pre-blinded at a first time and the recovery period of the first photodetector may be determined. Based on this determined recovery period, the timing at which the first photodetector is avalanched may be adjusted. A second photodetector (in LIDAR systems with more than one photodetector) may be pre blinded at the first time (or any other time) and the recovery period for the second photodetector may be determined. In some cases, the recovery period for the second photodetector may be different than the recovery period for the first photodetector, so the timing of the forced avalanching of the second photodetector may be adjusted to be different than the timing of the forced avalanching of the first photodetector. As a third example, as described below, the pre-blinding of the photodetector may be used to ensure the photodetector is not blinded before a light pulse emitted from the LIDAR system enters a region of interest in the environment. That is, the data received from the environment may provide an indication of a region of interest, and the timing at which the detector is blinded may be adjusted to correspond with a time before that region of interest.

In some embodiments, the photodetector may also be pre-blinded at times other than when the emitted light is traversing the interior of the LIDAR system. For example, there may be certain regions of interest in the environment that the LIDAR system may want to prioritize receiving information from. The regions of interest may include regions that are a particular distance from the LIDAR system. For example, if the LIDAR system is implemented on a vehicle, it may be important to focus on regions that are three feet in front of the vehicle (to provide an arbitrary example). The regions of interest may also involve regions that have been previously determined to include known objects that are desirable to track by the LIDAR system. For example, the LIDAR system may detect at a first time that a vehicle exists in a certain region in front of the LIDAR system, and may desire to ensure that return light from that vehicle is prioritized so that the vehicle may continue to be tracked. However, one issue that may arise with tracking these regions of interest may include the same issue that arises when internal reflections from the LIDAR system avalanche the photodetector and push the photodetector into its recovery period. That is, the photodetector may be avalanched immediately prior to a time at which return light from the region of interest would reach the photodetector, which may result in the photodetector being within its recovery period when the return light from the region of interest reaches the photodetector. This may cause the photodetector to be blind to the return light originating from the region of interest. This issue may be mitigated in a similar manner in which the photodetector blinding at short ranges may be alleviated as discussed above. That is, the photodetector may be forced to avalanche and enter its recovery period prior to the time at which return light from the environment that reaches the photodetector would have originated from the region of interest. The timing of the forced avalanching may be established such that the photodetector ends its recovery period and is able to detect returning light at the time corresponding to when return light from the environment would have originated from the region of interest. This pre-blinding may thus be performed at any time it is desired to know with certainty that the photodetector will not be in a recovery period and will be able to detect return light.

In some embodiments, the light source may be used for purposes beyond pre-blinding the photodetector as well. For example, the light source may be used for calibration purposes. Particularly, LIDAR receive systems often have an internal delay that exists between the time at which photons reach the photodetector and the time that the LIDAR system registers that the light has been detected. This delay may be variable and add an additional unknown to data processing that may be performed based on data being determined by the LIDAR system (for example, light returns being detected by a photodetector). To add more predictability to the internal LIDAR delay time, the delay between the controller providing a signal to the LED to turn on and the LED actually turning on may be measured. This delay may then be used as an estimate of the internal LIDAR delay time, which can provide an estimate of the receive system delay time as well. This may be beneficial to data processing on the LIDAR system in that it may provide a clearer estimate of when return light from the environment actually reaches the photodetector.

With reference to the figures, FIG. 1 includes a schematic diagram of an example process 100 for an exemplary LIDAR system 101 that may be used for pre-blinding photodetectors within the LIDAR system 101 as described above. With reference to the elements depicted in the process 100, the LIDAR system 101 may include at least one or more emitting devices 102 (which may be depicted as "laser 102"), one or more detector devices 103 (which may be depicted as "APD 103," but may include any other type of detector device described herein or otherwise), one or more light sources 104, and/or one or more controllers 105. The LIDAR system 101 may also include a light source driver 115 used to drive a light source 104 and one or more signal conditioning elements 116. The light source driver 115 may be a high-speed transistor and gate driver with a turn-on and/or turn-off delay. The signal conditioning elements 116 may be any post signal processing elements that may process any data being output by the detector devices 103, for example. The LIDAR system 101 may further optionally include one or more emitter-side optical elements (for example, which may be the same as optical element(s) 304 as described with respect to FIG. 3) and/or one or more receiver-side optical elements (for example, which may be the same as optical element(s) 308 as described with respect to FIG. 3). Additionally, external to the LIDAR system 101 may be an environment 108 that may include one or more objects (for example object 107a and/or object 107b). Hereinafter, reference may be made to elements such as "emitting device," "detector device," "light source," "controller," and/or "object," however such references may similarly apply to multiple of such elements as well.

In some embodiments, an emitting device 102 may be a laser diode for emitting a light pulse (for example, the emitter 302 as described below with reference to FIG. 3). A detector device 103 may be a photodetector (for example, the detector 306 as described below with reference to FIG. 3), such as an Avalanche Photodiode (APD), or more specifically an APD that may operate in Geiger Mode (however any other type of photodetector or photodiode may be used as well). It should be noted that the terms "photodetector" and "detector device" may be used interchangeably herein. The controller 105 may be a computing system (for example, the computing portion 313 described below with respect to FIG. 3) that may be used to control any of the operations described with respect to process 100. For example, the controller 105 may be used to control the times at which the light source 104 is driven to forcibly avalanche the detector device 103. Additionally, an object 107A, 107b, and/or 107c may be any object that may be found in the environment 108 of the LIDAR system 101 (for example, object 107a may be a pedestrian, object 107b may be a stop sign, and object 107c may be a vehicle, but any other number or type of objects may be present in the environment 108 as well).

In some embodiments, the light source 104 may be a component used to produce light that may be used to forcibly avalanche the detector device 103 as described above. The light source 104 may be positioned in front of and facing the detector 103 device, such that when the light source 104 is turned on, the light emitting from the light source 104 is detected by the detector device 103. The light source 104 may also be positioned at any number of orientations and/or distances from the detector device 103, as long as the detector device 103 is able to detect the light being emitted from the light source 104. However, the light source 104 may need to be positioned so that it does not physically block any of the light being emitted from the emitting device 102 (for example, the light pulse 106 as described below). The distance at which the light source 104 is positioned from the detector device 103 may also impact the timing at which the light source 104 needs to be triggered to provide light to the detector device 103. The farther away from the detector device 103 the light source 104 is, the longer the light from the light source 104 may take to reach the detector device 103, which may result in a longer period of time until the detector device 103 is avalanched and enters its recovery period. Based on this, the greater distance away from the detector device 103 the light source 104 is positioned, the earlier the light source 104 may need to be triggered. In some embodiments, the steps of the process 100 may proceed as follows. The process 100 may begin with an emitting device 102 emitting a light pulse 106. The light pulse 106 may not immediately exit the LIDAR system 101 and enter the environment 108, but may instead traverse the interior of the LIDAR system 101, which may be shown as distance di in the figure. As explained above, as the light pulse 106 traverses the distance di within the LIDAR system 101, at least some of the light pulse 106 may be internally reflected within the LIDAR system 101 and back towards the detector device 103. For example, some of the light pulse 106 may be reflected by optical elements, housing components, dust, grease, or any other elements that may be found within the LIDAR system. The internally-reflected light may cause the detector device 103 to avalanche and thus enter a recovery period during which it may be unable to detect any additional return light. This recovery period may extend beyond the time at which the portion of the light pulse 106 that was not internally reflected reaches the end 109 of the LIDAR system 101 and enters the environment 108 to travel towards objects in the environment (for example, object 107a, object 107b, and/or object 107c).

In some embodiments, in order to prevent the detector device 103 of the LIDAR system 101 from avalanching and entering a recovery period based on internal reflections of the light pulse 106 within the LIDAR system 106, the detector device 103 may be forced to avalanche and enter its recovery period during the time period that the light pulse 106 is traversing the distance di internal to the LIDAR system. This forced entry of the detector device 103 into its recovery period may be effectuated by the light source 104. That is, the light source 104 may be triggered so that the detector device 103 receives the light from the light source 104, which, in turn, may cause the detector device 103 to avalanche and enter its recovery period. More specifically, if the light source is an LED 104, the controller 105 may provide a signal to the light source driver 115 to provide a signal to trigger the LED to turn on. The controller 105 may control the timing at which the light source 104 is triggered to avalanche the detector device 103. In some instances, the controller 105 may provide a signal to trigger the light source 104 at a point in time before the emitting device 102 emits the light pulse 106. As described above, the light source 104 may need to be triggered to force the detector device 103 to avalanche before the light pulse 106 is emitted because the recovery time of the detector device 103 may be longer than the time it takes the light pulse 106 to travel the distance di through the LIDAR system 101.

Illustrative Methods

Figure 2:
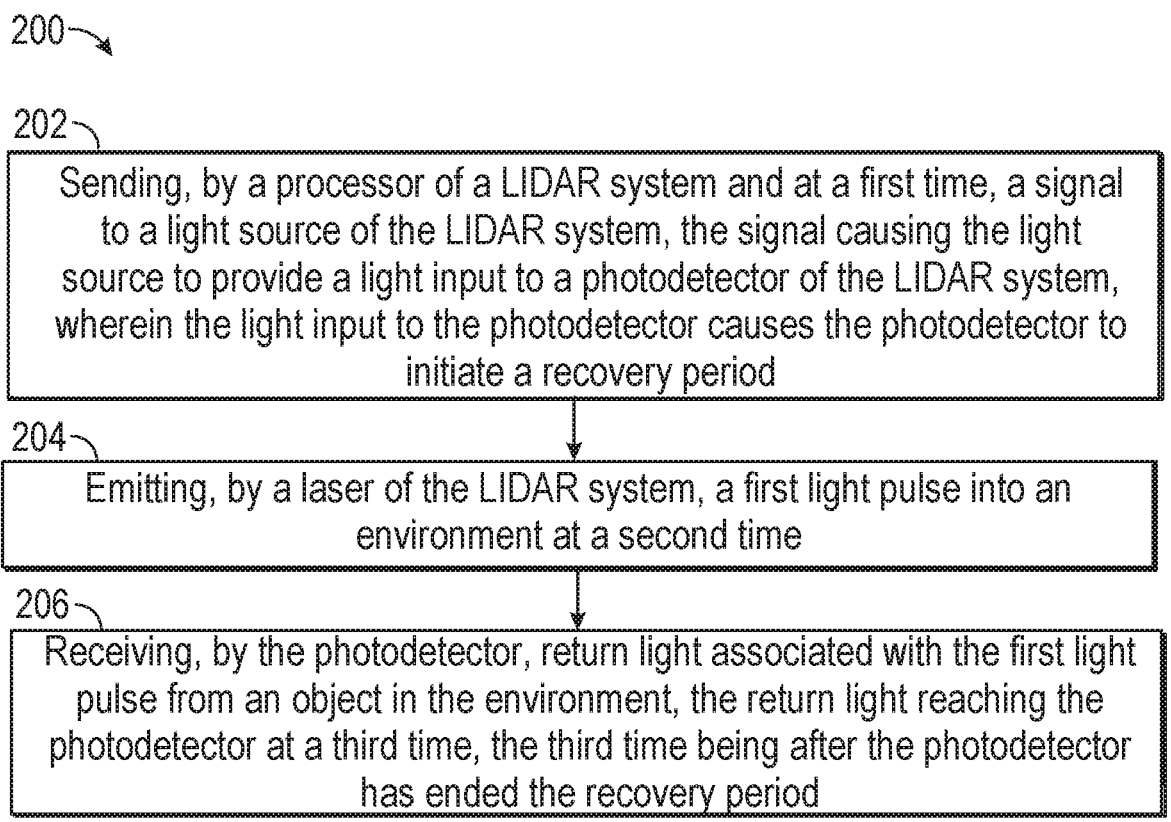
FIG. 2 depicts an example method, in accordance with one or more example embodiments of the disclosure.

FIG. 2 is an example method 200 for pre-blinding LIDAR detectors in accordance with one or more example embodiments of the disclosure.

At block 202 of the method 200 in FIG. 2, the method may include sending, by a processor of a LIDAR system and at a first time, a signal to a light source of the LIDAR system, the signal causing the light source to provide a light input to a photodetector of the LIDAR system, wherein the light input to the photodetector causes the photodetector to initiate a recovery period. In some instances, the photodetector may be a photodiode, which may be a diode that may be capable of converting incoming light photons into an electrical signal. The photodiode may be implemented in a LIDAR system that may emit light into an environment and may subsequently detect any light returning to the LIDAR system (for example, through the emitted light reflecting from an object in the environment) using the photodetector. As one example implementation, the LIDAR system may be implemented in a vehicle (for example, autonomous vehicle, semi-autonomous vehicle, or any other type of vehicle), however the LIDAR system may be implemented in other contexts as well. The photodetector may also more specifically be an Avalanche Photodiode (APD), which may function in the same manner as a normal photodiode, but may operate with an internal gain as well. Consequentially, an APD that receives the same number of incoming photons as a normal photodiode may produce a much greater resulting electrical signal through an "avalanching" of electrons, which may allow the APD to be more sensitive to smaller numbers of incoming photons than a normal photodiode. An APD may also operate in Geiger Mode, which may significantly increase the internal gain of the APD. An APD may also need to undergo a recovery period following the avalanche in which the APD is quenched. Quenching the APD may refer to reducing the voltage of the APD below its breakdown voltage so that the APD may be able to detect subsequent photons. This recovery period may take tens of nanoseconds to complete, which may be problematic if light emitted from the LIDAR system reflects from components internal to the LIDAR system and is detected by the photodetector. Such internal reflections may cause the photodetector to prematurely avalanche and enter its recovery period at a time after the light is emitted by an emitter (for example, a laser diode) within the LIDAR system, but before the emitted light exits the LIDAR system and enters the environment. The environment, for example, may refer to a region of space proximate to the LIDAR system. For example, if the LIDAR system is located on a vehicle that is traversing an intersection, and is emitted light pulses, the environment may refer to the portion of the intersection at which the light pule are being emitted. However, this is merely an example, and the environment may similarly refer to any other physical space external to the LIDAR system. Continuing with the above explanation, a photodetector avalanching as a result of internal reflections may result in the photodetector being in its recovery period for a period of time after the emitted light has entered the environment since the recovery time of the photodetector may be greater than the time it takes the emitted light to exit the LIDAR system. Consequentially, the photodetector may effectively be "blind" (for example, unable to detect photons) to short range return light. That is, if there are any objects within a short range of the LIDAR system that reflect the emitted light back to the photodetector, and the photodetector is still in its recovery period, then the photodetector may be unable to determine that the object exists in front of the LIDAR system. This may be problematic because any system that relies on the information captured by the LIDAR system may be unable to accurately and consistently detect when objects are located within a short range of the LIDAR system. For example, an autonomous vehicle that relies on a LIDAR system to perform object detection may often need to be able to detect objects as close as 10 centimeters away from the vehicle. It may take light less than a nanosecond to reach this range, so if the detector's recovery period if greater than this, then objects at this range may remain undetected.

In some embodiments, to alleviate this effective photodetector "blindness" to short range objects that may occur when internal reflections take place within the LIDAR system, the photodetector may be "pre-blinded" in such a manner that the photodetector may be forced to enter its recovery period. For example, this pre-blinding may be effectuated while emitted light is traveling through the interior portion of the LIDAR system, but may also be effectuated at any other time as well. Pre-blinding the photodetector may involve forcing the photodetector to avalanche by causing light from the light source to be emitted towards the photodetector (for example, light that may not necessarily have been emitted by the emitter in the LIDAR system, but from some other external light source pointed in the direction of the photodetector). This light input may be used to force the photodetector to avalanche in a manner similar to which it may avalanche as the result of return light from the environment reaching the photodetector. The light input may be provided by any number of light sources, for example, a Light Emitting Diode (LED). Using a high-speed LED may be beneficial because it may not require the power of a laser, but may have rapid response time for a wavelength the photodetector is capable of detecting. The photodetector may be sensitive to a much wider range of wavelengths than the emitter of the LIDAR system (for example, emitting device 102) so LED used for pre-blinding of the photodetector may not need to have the same wavelength as the emitter. This may allow for optical wavelength filtering to prevent the pre-blinding photons from the LED from bouncing around inside the LIDAR and tainting a received signal. The light source may also include any other type of photonic emitter (which may be controllable, for example) that may emit at least some energy on a wavelength that is detectable by the photodetector (to name a few additional examples, the light source may include an infrared (IR) LED), incandescent sources, halogen bulbs, gas lasers, etc.).

Block 204 of the method 200 may include emitting, by a laser of the LIDAR system, a first light pulse into an environment at a second time. Block 206 of the method 200 may include receiving, by the photodetector, return light associated with the first light pulse from an object in the environment, the return light reaching the photodetector at a third time, the third time being after the photodetector has ended the recovery period.

The operations described and depicted in the illustrative process flow of FIG. 2 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 2 may be performed.

Example Lidar System

Figure 3:
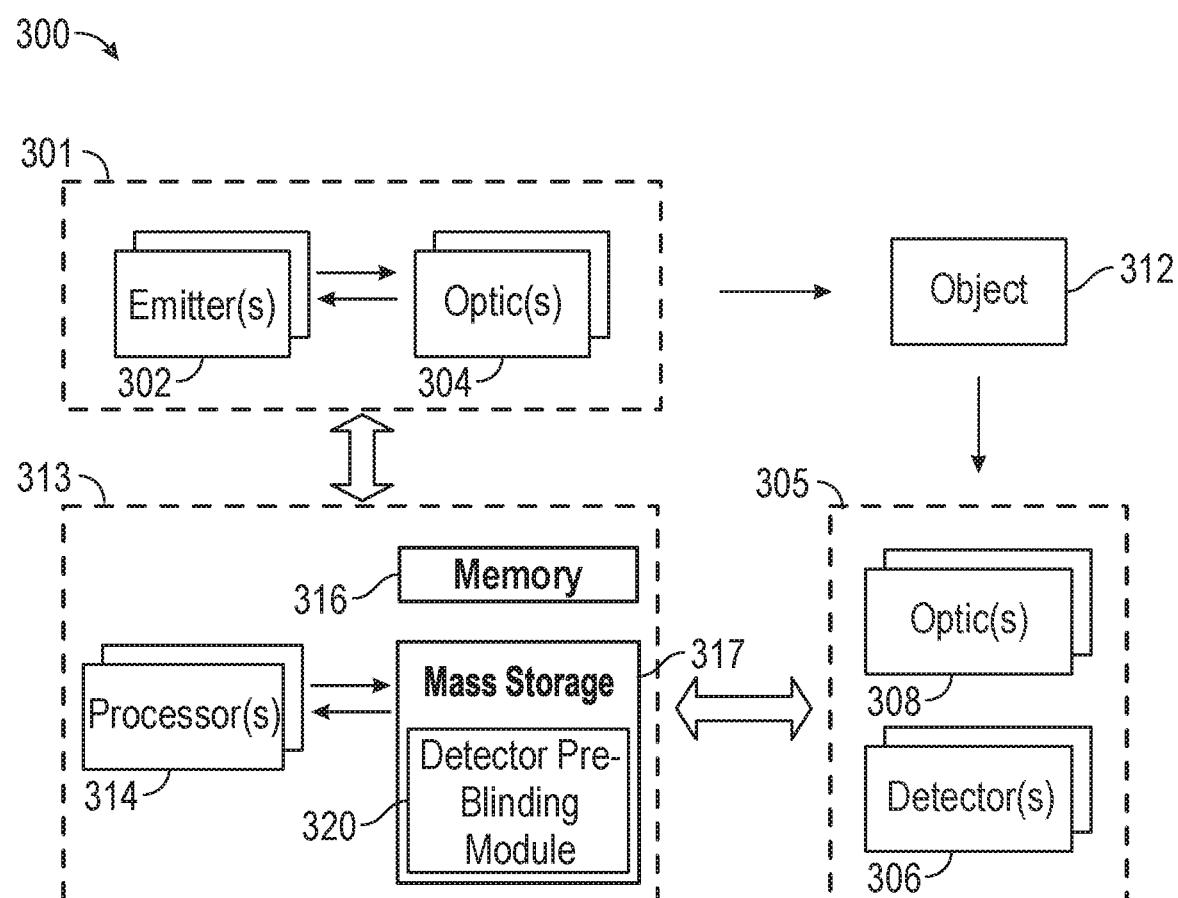
FIG. 3 depicts a schematic illustration of an example system architecture, in accordance with one or more example embodiments of the disclosure.

FIG. 3 illustrates an example LIDAR system 300, in accordance with one or more embodiments of this disclosure. The LIDAR system 300 may be representative of any number of elements described herein, such as the LIDAR system 100 described with respect to FIG. 1, as well as any other LIDAR systems described herein. The LIDAR system 300 may include at least an emitter portion 301, a detector portion 305, and a computing portion 313.

In some embodiments, the emitter portion 301 may include at least one or more emitter(s) 302 (for simplicity, reference may be made hereinafter to "an emitter," but multiple emitters could be equally as applicable) and/or one or more optical element(s) 304. An emitter 302 may be a device that is capable of emitting light into the environment. Once the light is in the environment, it may travel towards an object 312. The light may then reflect from the object and return towards the LIDAR system 300 and be detected by the detector portion 305 of the LIDAR system 300 as may be described below. For example, the emitter 302 may be a laser diode as described above. The emitter 302 may be capable of emitting light in a continuous waveform or as a series of pulses. An optical element 304 may be an element that may be used to alter the light emitted from the emitter 302 before it enters the environment. For example, the optical element 304 may be a lens, a collimator, or a waveplate. In some instances, the lens may be used to focus the emitter light. The collimator may be used to collimate the emitted light. That is, the collimator may be used to reduce the divergence of the emitter light. The waveplate may be used to alter the polarization state of the emitted light. Any number or combination of different types of optical elements 304, including optical elements not listed herein, may be used in the LIDAR system 300.

In some embodiments, the detector portion 305 may include at least one or more detector(s) 306 (for simplicity, reference may be made hereinafter to "a detector," but multiple detectors could be equally as applicable) and/or one or more optical elements 308. The detector may be a device that is capable of detecting return light from the environment (for example light that has been emitted by the LIDAR system 300 and reflected by an object 312). For example, the detectors may be photodiodes. The photodiodes may specifically include Avalanche Photodiodes (APDs), which in some instances may operate in Geiger Mode. However, any other type of photodetector may also be used. The functionality of the detector 306 in capturing return light from the environment may serve to allow the LIDAR system 100 to ascertain information about the object 312 in the environment. That is, the LIDAR system 100 may be able to determine information such as the distance of the object from the LIDAR system 100 and the shape and/or size of the object 312, among other information. The optical element 308 may be an element that is used to alter the return light traveling towards the detector 306. For example, the optical element 308 may be a lens, a waveplate, or filter such as a bandpass filter. In some instances, the lens may be used to focus return light on the detector 306. The waveplate may be used to alter the polarization state of the return light. The filter may be used to only allow certain wavelengths of light to reach the detector (for example a wavelength of light emitted by the emitter 302). Any number or combination of different types of optical elements 308, including optical elements not listed herein, may be used in the LIDAR system 300.

In some embodiments, the computing portion 313 may include one or more processor(s) 314 and memory 316. In some instances, the computing portion 313 may be the controller 105, or any other controller described herein. However, the computing portion 313 may not necessarily be limited to a controller. The processor 314 may execute instructions that are stored in one or more memory devices (referred to as memory 316). The instructions can be, for instance, instructions for implementing functionality described as being carried out by one or more modules and systems disclosed above or instructions for implementing one or more of the methods disclosed above. The processor(s) 314 can be embodied in, for example, a CPU, multiple CPUs, a GPU, multiple GPUs, a TPU, multiple TPUs, a multi-core processor, a combination thereof, and the like. In some embodiments, the processor(s) 314 can be arranged in a single processing device. In other embodiments, the processor(s) 314 can be distributed across two or more processing devices (for example multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), a FPGA, a PLC, a complex programmable logic device (CPLD), a discrete gate or transistor logic, discrete hardware components, or any combination thereof designed or otherwise configured (for example manufactured) to perform the functions described herein.

The processor(s) 314 can access the memory 316 by means of a communication architecture (for example a system bus). The communication architecture may be suitable for the particular arrangement (localized or distributed) and type of the processor(s) 314. In some embodiments, the communication architecture 306 can include one or many bus architectures, such as a memory bus or a memory controller; a peripheral bus; an accelerated graphics port; a processor or local bus; a combination thereof; or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 316 also can retain data.

Each computing device 300 also can include mass storage 317 that is accessible by the processor(s) 314 by means of the communication architecture 306. The mass storage 317 can include machine-accessible instructions (for example computer-readable instructions and/or computer-executable instructions). In some embodiments, the machine-accessible instructions may be encoded in the mass storage 317 and can be arranged in components that can be built (for example linked and compiled) and retained in computer-executable form in the mass storage 317 or in one or more other machine-accessible non-transitory storage media included in the computing device 300. Such components can embody, or can constitute, one or many of the various modules disclosed herein. Such modules are illustrated as detector pre-blinding module 320.

The detector pre-blinding module 320 including computer-executable instructions, code, or the like that responsive to execution by one or more of the processor(s) 314 may perform functions including any functions described with respect to FIG. 2, for example. Additionally, the functions may include execution of any other methods and/or processes described herein.

It should further be appreciated that the LIDAR system 300 may include alternate and/or additional hardware, software, or firmware components beyond those described or depicted without departing from the scope of the disclosure. More particularly, it should be appreciated that software, firmware, or hardware components depicted as forming part of the computing device 300 are merely illustrative and that some components may not be present or additional components may be provided in various embodiments. While various illustrative program modules have been depicted and described as software modules stored in data storage, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (for example data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (for example data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (for example computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

That which is claimed is:

1. A method comprising:
sending, by a processor of a LIDAR system and at a first time, a signal to a light source of the LIDAR system, the signal causing the light source to provide a light input to a photodetector of the LIDAR system, wherein the light input to the photodetector causes the photodetector to initiate a recovery period;
emitting, by a laser of the LIDAR system, a first light pulse into an environment at a second time after the light input is provided to the photodetector;
receiving, by the photodetector, return light associated with the first light pulse from an object in the environment, the return light reaching the photodetector at a third time, the third time being after the photodetector has ended the recovery period;
determining, based on an amount of time between the processor causing to send the signal and the light source producing the light input, an internal delay of the LIDAR system; and
adjusting, based on the internal delay, a time at which the signal is sent to the light source of the LIDAR system.

2. The method of claim 1, wherein the first time is based on a recovery period time of the photodetector and an amount of time the first light pulse takes to travel from the laser to the environment, wherein the environment is external to the LIDAR system.

3. The method of claim 2, wherein the light source is at least one of: a Light Emitting Diode (LED), an Infrared (IR) LED, or a photonic emitter that emits a wavelength in a detection range of the photodetector.

4. The method of claim 1, further comprising:
sending, by a processor of the LIDAR system and at a fourth time, a second signal to the light source of the LIDAR system, the second signal causing the light source to provide a second light input to the photodetector, wherein the second light input to the photodetector causes the photodetector to enter a second recovery period;
emitting, by the laser of an LIDAR system, a second light pulse into the environment at a fifth time; and
receiving, by the photodetector, return light associated with the second light pulse from an object in the environment, the return light reaching the photodetector at a sixth time, the sixth time being after the photodetector has ended the second recovery period.

5. The method of claim 4, wherein the sixth time corresponds to a region of interest in the environment.

6. The method of claim 1, wherein the photodetector is an Avalanche Photodiode operating in Geiger Mode.

7. A LIDAR system comprising:
a processor; and
a memory storing computer-executable instructions, that when executed by the processor, cause the processor to:
send, by a processor of the LIDAR system and at a first time, a signal to a light source of the LIDAR system, the signal causing the light source to provide a light input to a photodetector of the LIDAR system, wherein the light input to the photodetector causes the photodetector to initiate a recovery period;
emit, by a laser of the LIDAR system, a first light pulse into an environment at a second time after the light input is provided to the photodetector;
receive, by the photodetector, return light associated with the first light pulse from an object in the environment, the return light reaching the photodetector at a third time, the third time being after the photodetector has ended the recovery period;
determine, based on an amount of time between the processor causing to send the signal and the light source producing the light input, an internal delay of the LIDAR system; and
adjust, based on the internal delay, a time at which the signal is sent to the light source of the LIDAR system.

8. The system of claim 7, wherein the first time is based on a recovery period time of the photodetector and an amount of time the first light pulse takes to travel from the laser to the environment, wherein the environment is external to the LIDAR system.

9. The system of claim 8, wherein the light source is at least one of: a Light Emitting Diode (LED), an Infrared (IR) LED, or a photonic emitter that emits a wavelength in a detection range of the photodetector.

10. The system of claim 7, wherein computer-executable instructions further cause the processor to:
send, at a fourth time, a second signal to the light source of the LIDAR system, the second signal causing the light source to provide a second light input to the photodetector, wherein the second light input to the photodetector causes the photodetector to enter a second recovery period;
emit, by the laser of the LIDAR system, a second light pulse into the environment at a fifth time; and
receive, by the photodetector, return light associated with the second light pulse from an object in the environment, the return light reaching the photodetector at a sixth time, the sixth time being after the photodetector has ended the second recovery period.

11. The system of claim 10, wherein the sixth time corresponds to a region of interest in the environment.

12. The system of claim 7, wherein the photodetector is an Avalanche Photodiode operating in Geiger Mode.

13. A non-transitory computer readable medium including computer-executable instructions stored thereon, which when executed by one or more processors of a wireless access point, cause the one or more processors to perform operations of:
causing to send, by a processor of a LIDAR system and at a first time, a signal to a light source of the LIDAR system, the signal causing the light source to provide a light input to a photodetector of the LIDAR system, wherein the light input to the photodetector causes the photodetector to initiate a recovery period;
causing to emit, by a laser of the LIDAR system, a first light pulse into an environment at a second time after the light input is provided to the photodetector, wherein return light associated with the first light pulse is received by a photodetector of the LIDAR system from an object in the environment, the return light reaching the photodetector at a third time, the third time being after the photodetector has ended the recovery period;
determining, based on an amount of time between the processor causing to send the signal and the light source producing the light input, an internal delay of the LIDAR system; and
adjusting, based on the internal delay, a time at which the signal is sent to the light source of the LIDAR system.

14. The non-transitory computer readable medium of claim 13, wherein the first time is based on a recovery period time of the photodetector and an amount of time the first light pulse takes to travel from the laser to the environment, wherein the environment is external to the LIDAR system.

15. The non-transitory computer readable medium of claim 14, wherein the light source is at least one of: a Light Emitting Diode (LED), an Infrared (IR) LED, or a photonic emitter that emits a wavelength in a detection range of the photodetector.

16. The non-transitory computer readable medium of claim 13, wherein the computer-executable instructions further cause the one or more processors to perform operations of:
   sending, by a processor of the LIDAR system and at a fourth time, a second signal to the light source of the LIDAR system, the second signal causing the light source to provide a second light input to the photodetector, wherein the second light input to the photodetector causes the photodetector to enter a second recovery period;
   emitting, by the laser of an LIDAR system, a second light pulse into the environment at a fifth time; and
   receiving, by the photodetector, return light associated with the second light pulse from an object in the environment, the return light reaching the photodetector at a sixth time, the sixth time being after the photodetector has ended the second recovery period.

17. The non-transitory computer readable medium of claim 16, wherein the sixth time corresponds to a region of interest in the environment.

* * * * *